(12) United States Patent
Ha et al.

(10) Patent No.: US 6,673,161 B2
(45) Date of Patent: Jan. 6, 2004

(54) SUBSTRATE HANDLING END EFFECTOR

(75) Inventors: Tuan T. Ha, Dedham, MA (US); Hakan Elmali, Groton, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 195 days.

(21) Appl. No.: 09/898,693

(22) Filed: Jul. 3, 2001

(65) Prior Publication Data

US 2003/0005947 A1 Jan. 9, 2003

(51) Int. Cl.[7] .............................. B08B 7/04; B08B 5/04; B08B 9/035
(52) U.S. Cl. ..................... 134/21; 134/22.12; 134/104.1
(58) Field of Search ........................... 134/34, 21, 22.1, 134/22.11, 22.12, 26, 104.2, 94.1, 95.1, 104.1, 166 R; 294/64.1, 64.3; 414/676

(56) References Cited

U.S. PATENT DOCUMENTS

| | | | |
|---|---|---|---|
| 5,064,340 A | 11/1991 | Genov et al. | ................ 414/744 |
| 5,324,155 A | 6/1994 | Goodwin et al. | ............ 414/225 |
| 5,803,979 A | 9/1998 | Hine et al. | ...................... 134/2 |
| 6,241,226 B1 * | 6/2001 | Olsen et al. | ................... 269/15 |

* cited by examiner

Primary Examiner—Alexander Markoff
(74) Attorney, Agent, or Firm—Perman & Green, LLP; Richard Pickreign

(57) ABSTRACT

A substrate handling end effector is provided. The substrate handling end effector has a vacuum chuck to support a semiconductor substrate thereon. A vacuum passage and a liquid passage are located in the vacuum chuck. The vacuum passage is adapted to be connected to a vacuum source and the liquid passage is adapted to be connected to a liquid source. The liquid passage is connected to the vacuum passage.

20 Claims, 5 Drawing Sheets

SUBSTRATE HANDLING END EFFECTOR

BACKGROUND OF THE INVENTION

1. Field of the Invention

The present invention relates to a substrate handling apparatus, and more particularly to, an end effector on a substrate handling apparatus.

2. Prior Art

It is well known to use articulated arms to transport semiconductor wafers, plates and flat panel displays between cassettes, load locks, process modules and other work stations. Recent developments in the processing of semiconductors include the introduction of chemical metal polishing (CMP) and copper deposition whereby articulated arms can be exposed to abrasive or corrosive liquids and corrosive gasses. These fluids and gasses can infiltrate the clamping chuck of the end effector used to support the substrates and cause premature failure of mechanical and electrical components due to contamination and corrosion. U.S. Pat. No. 5,803,979 discloses a transport apparatus for semiconductor wafers that have been subject to chemical metal polishing (CMP). It discloses an end effector that can be easily removed for cleaning and an arm with catch chambers to collect materials drawn into the vacuum chuck. It also discloses cleaning fluid passed outwards through a vacuum passage in order to flush out materials from the end effector to the work area. A difficulty arises in that there must be a place within the work area to deposit the flushed materials from the end effector. Accordingly, there is a desire to provide a substrate transfer apparatus where cleaning fluid may be flushed through the vacuum passage in order to flush materials from the vacuum passage where the cleaning fluid remains internal to the substrate transfer apparatus.

SUMMARY OF THE INVENTION

In accordance with one embodiment of the present invention, a substrate handling end effector is provided. The substrate handling end effector has a vacuum chuck to support a semiconductor substrate thereon. A vacuum passage and a liquid passage are located in the vacuum chuck. The vacuum passage is adapted to be connected to a vacuum source and the liquid passage is adapted to be connected to a liquid source. The liquid passage is connected to the vacuum passage.

In accordance with another embodiment of the present invention, a semiconductor substrate transfer apparatus is provided. The semiconductor substrate transfer apparatus has a drive and an arm connected to the drive. A vacuum source and a liquid source are provided. An end effector is coupled to the arm and adapted to support a substrate. The end effector has a substrate support comprising a vacuum passage connected to the vacuum source, and a liquid passage connected to the vacuum passage and connectable to the liquid source. A liquid is adapted to be dispensed from the liquid passage to the vacuum passage.

In accordance with a method of the present invention, A method of cleaning a vacuum passage in a substrate supporting end effector is provided. A vacuum source is connected to a vacuum passage of a substrate support of the end effector. A source of liquid is then connected to a liquid passage of the substrate support. Liquid is transported from the liquid passage into and through the vacuum passage.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENT

Figure 1:
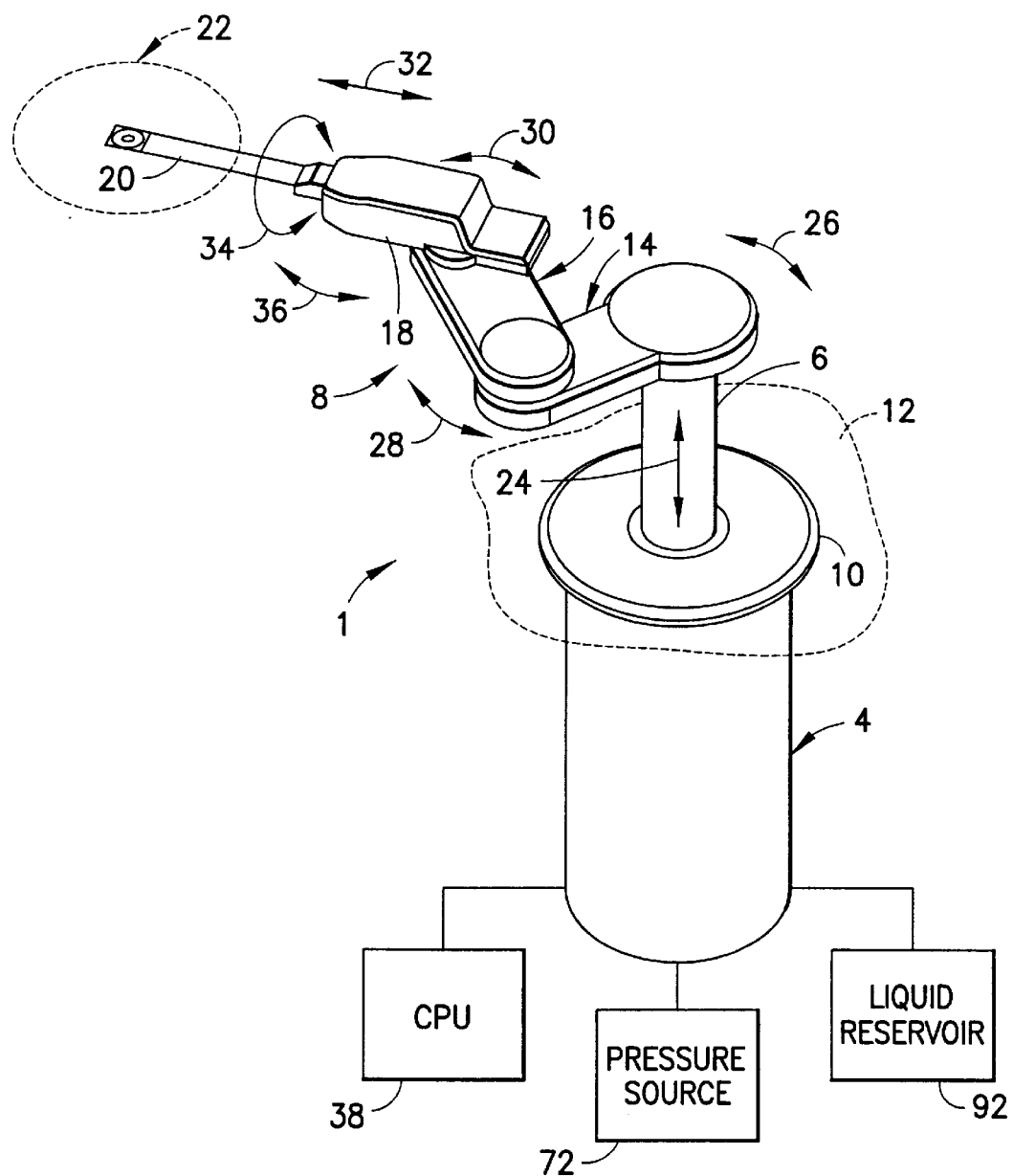
FIG. 1 is a perspective view of a substrate transfer apparatus incorporating features of the present invention.

Referring now to FIG. 1, there is shown a perspective view of a substrate transfer apparatus 1 incorporating features of the present invention. Although the present invention will be described with reference to the embodiments shown in the drawings, it should be understood that the present invention may be embodied in many alternate forms of embodiments. In addition, any suitable size, shape or type of elements or materials could be used. The substrate transfer apparatus 1 is adapted to transport substrates such as semiconductor wafers, such as Silicon, Gallium Arsenide, semi conductor packaging substrates, such as high density interconnects, semiconductor manufacturing process imaging plates, such as masks or reticles, and large area display panels, such as Active Matrix LCD substrates or Field Emission Diode substrates.

The substrate transfer apparatus 1 includes a drive housing 4, a drive shaft 6, driven arm 8 and mounting flange 10. Mounting flange 10 is fastened to work surface 12. Contaminants, such as corrosive or abrasive liquids are restricted to the side of work surface 12 and mounting flange 10 which driven arm 8 operates; typically by static sealing mounting flange 10 to work surface 12, such as by gasket or o-ring clamping or clamping. Work surface 12 tends to act as a barrier to prevent contaminants, such as corrosive or abrasive liquids, from exposing the exterior of drive housing 4 to such contaminants. The driven arm 8 may include a first link 14 connected to drive shaft 6, a second link 16 rotatably connected to the first link 14, wrist 18 rotatably connected to second link 16 and end effector 20 that utilizes a vacuum grip when moving semiconductor substrate 22. The arm 8 may move in the vertical direction 24 and/or in the rotary direction 26 relative to drive housing 4. Second arm 16 may rotate in the rotary direction 28 relative to first arm 14. Wrist 18 may rotate in the rotary direction 30 relative to second arm 16. End effector 20 may be fixed relative to wrist 18 or may alternately rotate in directions 30, 34 or 36 relative to wrist 18. Controller 38 is shown as a separate controller, but may be incorporated in drive housing 4 or distributed within substrate transfer apparatus 1. Controller 38 typically operates and controls drive housing 4 and arm 8 such that substrate 22 may be selectively picked or placed within the work envelope of substrate transfer apparatus 1. In alternate embodiments, the end effector 20 could be connected to any suitable type of robot or substrate transfer apparatus. The robot could have multiple ones of the end effector 20. The system 1 could also have any suitable type of driven arm and/or any suitable type of drive and/or any suitable type of controller.

Figure 2:
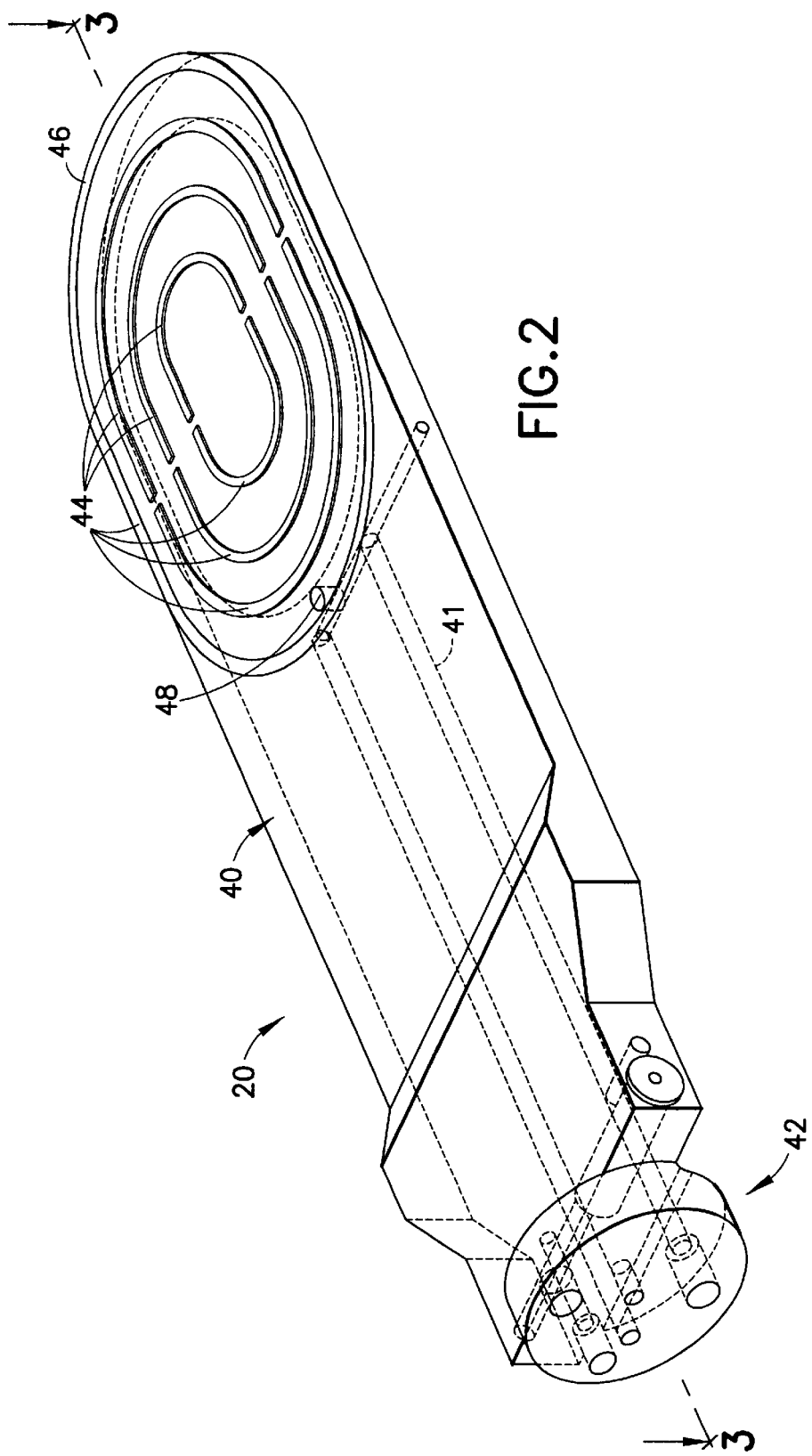
FIG. 2 is a perspective view of a substrate handling end effector shown in FIG. 1 incorporating features of the present invention.

Referring also to FIG. 2, there is shown a perspective view of the substrate handling end effector 20 incorporating features of the present invention. Substrate handling end effector 20 generally comprises a frame 40 and a conduit system 41, the frame 40 may be typically made from metal such as steel, aluminum, molybdenum or other appropriate metal. Frame 40 may alternately be made from ceramic, plastic or from another material suitable for an end effector. Coupled to frame 40 is a mounting flange 42 that is used to mount the end effector 20 to the wrist 18 of the substrate transfer apparatus. Mounting flange 42 may be an integral part of frame 40 or alternately fastened separately. The frame 40 comprises a substrate supporting surface 46. The substrate supporting surface 44 is provided to support a substrate on the substrate handling end effector 20. The outer supporting surface 46 of substrate supporting surface 44 forms an area on which a vacuum may act on a substrate supported by substrate supporting surface 44. Substrate supporting surface 44 is shown as machined integral with frame 40, but may alternately be a separate insert or made from a different material.

Figure 3:
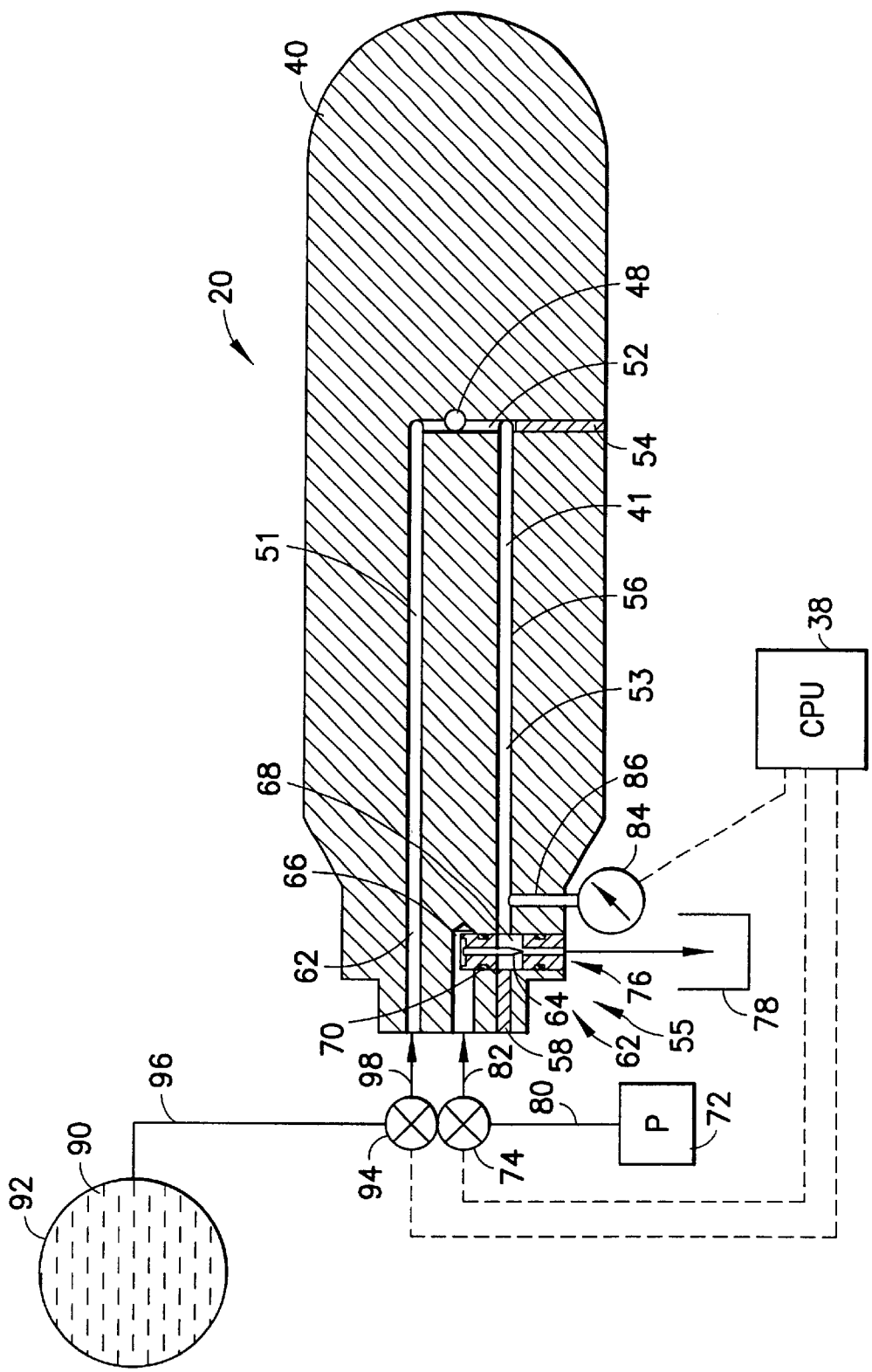
FIG. 3 is a schematic sectioned view of the substrate handling end effector shown in FIG. 2 taken along line 3—3.

Referring also to FIG. 3, there is shown a schematic sectioned view of the substrate handling end effector 20 shown in FIG. 2 taken along line 3—3. The conduit system 41 generally comprises a liquid supply conduit 51, a liquid and vacuum return conduit 53, a pressure supply conduit 66, a vacuum source 55, and a vacuum port 48. Vacuum port 48 is provided to allow a vacuum to be pulled on a substrate placed on substrate supporting surface 44. Passage 52 is drilled into frame 40 and sealed with plug 54. Passage 52 communicates with vacuum port 48. Vacuum passage 56 is drilled into frame 40 and sealed with plug 58. Vacuum passage 56 communicates with passage 52 in order to communicate with vacuum port 48. Liquid passage 60 is drilled into frame 40. Liquid passage 60 communicates with passage 52 in order to communicate with vacuum port 48. The liquid supply conduit 51 is formed by the liquid passage 60 and part of the passage 52. The liquid and vacuum return conduit 53 is formed by the vacuum passage 56, part of the passage 52, vacuum port 48, and part of the vacuum source 55. Although vacuum passage 56 and liquid passage 60 are shown as drilled integral with frame 40, they may alternately be in the form of tubing proximate to frame 40 but still communicating with vacuum port 48. Although vacuum passage 56 and liquid passage 60 are shown as communicating with passage 52 in order to communicate with vacuum port 48, they may alternately be drilled or plumbed so as to communicate directly with vacuum port 48 without the need for passage 52.

The vacuum source 55 generally comprises a venturi pump 62. In this embodiment, the pump 62 is provided in frame 40. Venturi pump 62 has a venturi nozzle 64, a high pressure side 66 and a suction side 68. High pressure side 66 is sealed from suction side 68 with o-ring 70. Compressed air, other gas or fluid is introduced into high pressure side 66 from pressure source 72. Pressure source 72 may be a compressor, pump or other source of pressure. Pressure source 72 may be located in close proximity to end effector 20 or may be located remote. Valve 74 can be used to selectively isolate pressure source 72 from high pressure side 66. Valve 74 is connected to pressure source 72 with tubing 80, but may be alternately be connected directly to pressure source 72. Valve 74 is connected to frame 40 with tubing 82, but may be alternately be connected directly to frame 40 or high pressure side 66. Valve 74 may be located in close proximity to end effector 20 or pressure source 72 or may be located remote. Gas or fluid from pressure source 72 flows through venturi nozzle 64 creating a suction on suction side 68. Suction side 68 is in communication with vacuum passage 56. The fluid in vacuum passage 56 is entrained by flow through the venturi nozzle 64 resulting in a vacuum in vacuum passage 56. The combined fluid from venturi nozzle 64 and vacuum passage 56 is ejected at exhaust 76 and any resulting fluid or solid collected in accumulator 78. Exhaust 76 is shown ejecting directly into accumulator 78 but may alternately be connected to accumulator 78 with a tube or otherwise. Pressure switch or pressure sensor 84 is in communication with vacuum passage 56 via port 86. Alternately, the invention may operate without pressure switch or pressure sensor 84. Pressure switch 84 senses the vacuum level in vacuum passage 56 and may trigger a bit when the vacuum level in vacuum passage 56 reaches a preset level. Alternately, pressure switch 84 may have a readable output proportional to the vacuum level in vacuum passage 56. Liquid 90 is introduced into liquid passage 60 from liquid source 92. Liquid 90 may be water, cleaning fluid or other liquid suitable for cleaning or purging vacuum passage 56. Liquid source 92 may be a reservoir, pump or other source of liquid 90 and may or may not be under pressure. Liquid source 92 may be located in close proximity to end effector 20 or may be located remote. Valve 94 isolates liquid source 92 from liquid passage 60. Valve 94 is connected to liquid source 92 with tubing 96, but may be alternately be connected directly to liquid source 92. Valve 74 is connected to frame 40 with tubing 98 but may be alternately be connected directly to frame 40 or liquid passage 60. Valve 94 may be located in close proximity to end effector 20 or liquid source 92 or may be located remote. Liquid 90 from liquid source 92 flows through liquid passage 60 through vacuum passage 56 when a suction is created in vacuum passage 56 and valve 94 is open.

Controller 38 is connected to valves 74 and 94 and to vacuum switch 84. In normal operation, valve 94 is closed. In order for end effector 20 to retain a substrate, the substrate would be placed on frame 40. Valve 74 would then be opened by controller 38, causing a vacuum to be pulled on vacuum passage 56 and, as a result, a vacuum to be pulled on the volume in communication with vacuum passage 56. Controller 38 would then monitor vacuum switch 84 until a vacuum pressure setpoint has been reached, at which time controller 38 would indicate that the substrate has been gripped. To release the substrate, controller 38 would close valve 74, allowing vacuum passage 56 and the volume in communication with vacuum passage 56 to vent back to atmospheric pressure.

In the course of gripping and releasing substrates, contaminants such as slurry, compound or otherwise can accumulate in vacuum passage 56. To purge out such contaminants, controller 38 opens both valve 74 and valve 94 allowing cleaning fluid 90 to flow through vacuum passage 56 to remove the contaminants. The purging may happen with or without a substrate on end effector 20. After the purging is complete, normal operation may resume with valve 94 closed.

Figure 5:
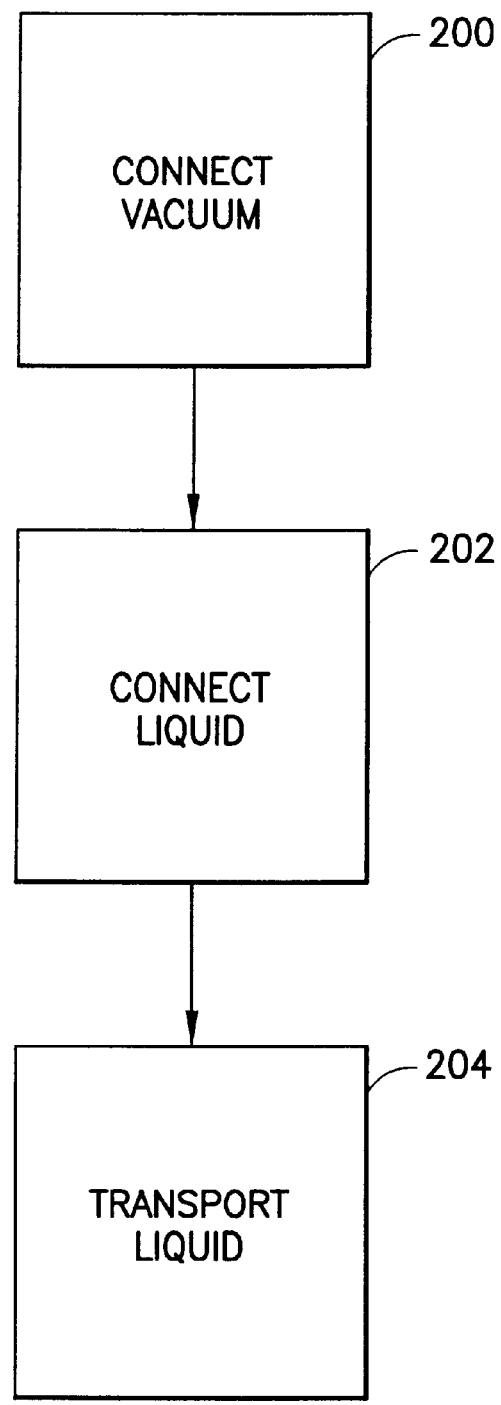
FIG. 5 is a flow chart of a method incorporating features of the present invention.

Referring also to FIG. 5 there is shown a flow chart of a method incorporating features of the present invention. In the course of gripping and releasing substrates, contaminants such as slurry, compound or otherwise can be retained in the vacuum passage. To purge out such contaminants, controller 38 executes a first step 200 to connect a vacuum source to the vacuum passage of the substrate support of the end effector. This step may be accomplished by connecting any type of vacuum source or by opening a valve such as valve 74 or 116 as before described. Controller 38 then executes a second step 202 of connecting a source of liquid to the liquid passage of the substrate support of the end effector. This step may be accomplished by connecting any type of liquid source or by opening a valve such as valve 79 as before described. The third step 204 of transporting the liquid from the liquid passage into and through the vacuum passage allows cleaning fluid 90 to flow through the vacuum passage until the contaminants have been removed. This step is accomplished by allowing the liquid to be drawn from the liquid source by the vacuum source, but may alternately be accomplished by any method of pumping or drawing the liquid from the liquid source through the vacuum passage. The purging method may happen with or without a substrate on the end effector.

Figure 4:
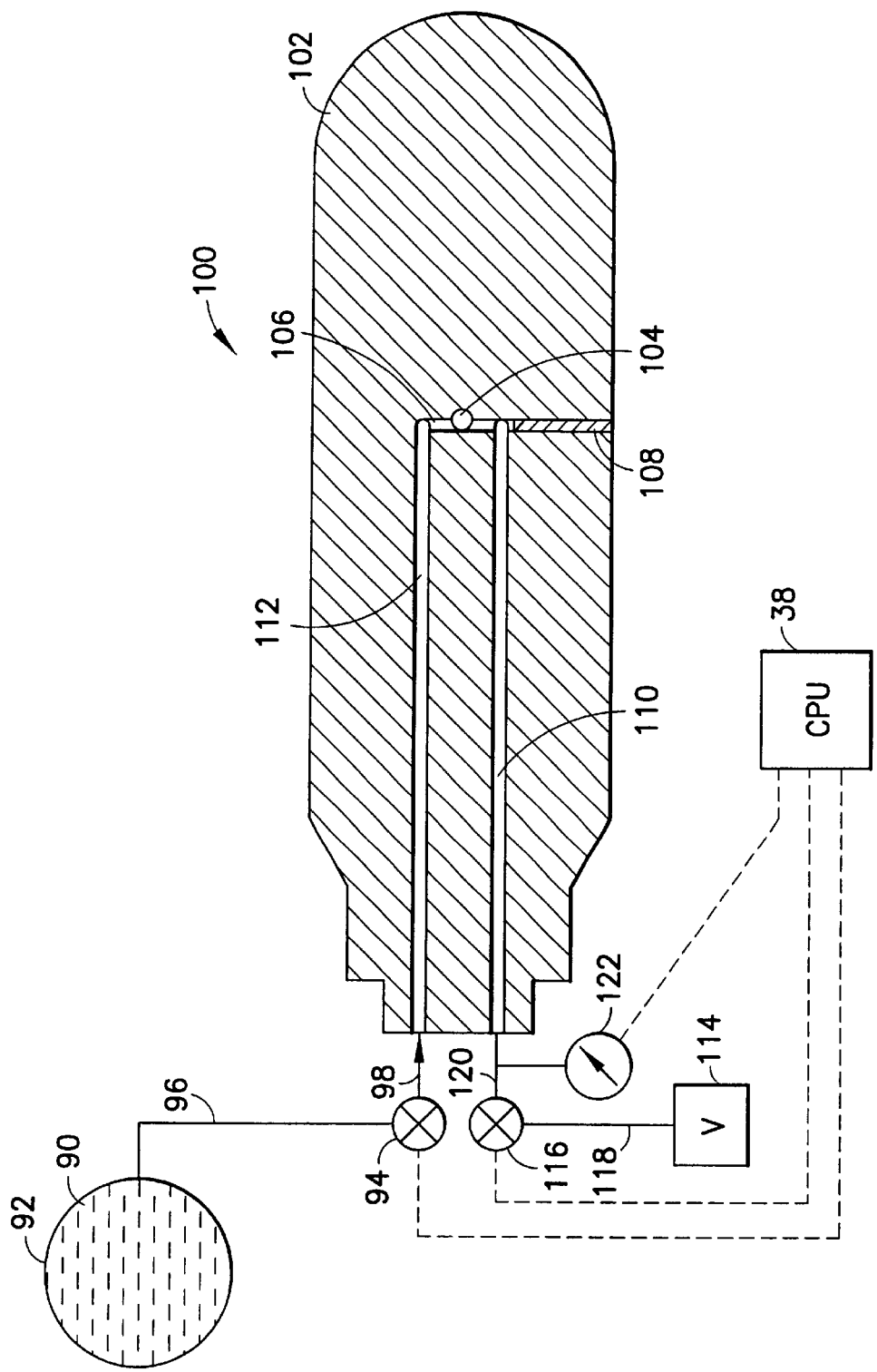
FIG. 4 is a schematic sectioned view similar to that shown in FIG. 3 of an alternative substrate handling end effector.

Referring now to FIG. 4, there is shown a schematic sectioned view, similar to that shown in FIG. 3, of an alternative substrate handling end effector 100. Substrate handling end effector 100 has a frame 102 and vacuum port 104. Vacuum port 104 is provided to allow a vacuum to be pulled on a substrate placed on end effector 100. Passage 106 is drilled into frame 102 and sealed with plug 108. Passage 106 communicates with vacuum port 104. Vacuum passage 110 is drilled into frame 102. Vacuum passage 110 communicates with passage 106 in order to communicate with vacuum port 104. Liquid passage 112 is drilled into frame 102. Liquid passage 112 communicates with passage 106 in order to communicate with vacuum port 104. Although vacuum passage 110 and liquid passage 112 are shown as drilled integral with frame 102, they may alternately be in the form of tubing proximate to frame 102 but still communicating with vacuum port 104. Although vacuum passage 110 and liquid passage 112 are shown as communicating with passage 106 in order to communicate with vacuum port 104, they may alternately be drilled or plumbed so as to communicate directly with vacuum port 104 without the need for passage 106.

A vacuum source comprising vacuum pump 114 is connected to frame 102. Vacuum pump 114 may be a diaphragm pump, centrifugal pump, ejector pump or other suitable source of vacuum. Vacuum pump 114 may be located in close proximity to end effector 100 or may be located remote. Valve 116 isolates vacuum pump 114 from vacuum passage 110. Valve 116 is connected to vacuum pump 114 with tubing 118, but may alternately be connected directly to vacuum pump 114. Valve 116 is connected to frame 102 with tubing 120, but may be alternately be connected directly to frame 102 or vacuum passage 110. Valve 116 may be located in close proximity to end effector 100 or vacuum pump 114 or may be located remote. Pressure switch 122 is in communication with vacuum passage 110 via tubing 120. Pressure switch 122 senses the vacuum level in vacuum passage 110 and may trigger a bit when the vacuum level in vacuum passage 110 reaches a preset level. Alternately, pressure switch 122 may have a readable output proportional to the vacuum level in vacuum passage 110. Liquid 90 is introduced into liquid passage 112 from liquid source 92. Liquid 90 may be water, cleaning fluid or other liquid suitable for cleaning or purging vacuum passage 110. Liquid source 92 may be a reservoir, pump or other source of liquid 90 and may or may not be under pressure. Liquid source 92 may be located in close proximity to end effector 100 or may be located remote. Valve 94 isolates liquid source 92 from liquid passage 112. Valve 94 is connected to liquid source 92 with tubing 96, but may be alternately be connected directly to liquid source 92. Valve 94 is connected to frame 102 with tubing 98 but may be alternately be connected directly to frame 102 or liquid passage 112. Valve 94 may be located in close proximity to end effector 100 or liquid source 92 or may be located remote. Liquid 90 from liquid source 92 flows through liquid passage 112 through vacuum passage 110 when a suction is created in vacuum passage 110 and valve 94 is open.

Controller 38 is connected to valves 116 and 94 and to vacuum switch 122. In normal operation, valve 94 is closed. In order for end effector 100 to retain a substrate, the substrate would be placed on frame 102. Valve 116 would then be opened by controller 38, causing a vacuum to be pulled on vacuum passage 110 and, as a result, the volume in communication with vacuum passage 110. Controller 38 would then monitor vacuum switch 122 until a vacuum pressure setpoint has been reached, at which time controller 38 would indicate that the substrate has been gripped. To release the substrate, controller 38 would close valve 116, allowing vacuum passage 110 and, as a result, the volume in communication with vacuum passage 110 to vent back to atmospheric pressure. In the course of gripping and releasing substrates, contaminants such as slurry, compound or otherwise can be retained in vacuum passage 110. To purge out such contaminants, controller 38 opens both valve 116 and valve 94 allowing cleaning fluid 90 to flow through vacuum passage 110 until the contaminants have been removed. The purging may happen with or without a substrate on end effector 100. After the purging is complete, normal operation may resume with valve 94 closed.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A substrate handling end effector comprising:
    a vacuum chuck adapted to support a semiconductor substrate thereon;
    a vacuum passage located in the vacuum chuck; and
    a liquid passage located in the vacuum chuck;
    wherein the vacuum passage is adapted to be connected to a vacuum source and the liquid passage is adapted to be connected to a liquid source and, wherein the liquid passage is connected to the vacuum passage for selectably drawing liquid from the liquid source through the vacuum passage.

2. The substrate handling end effector of claim 1 wherein the vacuum source comprises a venturi connected to a pressure source.

3. The substrate handling end effector of claim 1, wherein a controller is adapted to dispense a liquid from the liquid source to the vacuum passage by selectively opening a purge valve and, wherein the purge valve is connected between the liquid passage and the liquid source.

4. A substrate transfer apparatus comprising a drive, an arm connected to the drive and the substrate handling end effector of claim 1 connected to the arm.

5. The substrate handling end effector of claim 1 wherein the vacuum source comprises a vacuum pump and a vacuum valve connecting the vacuum pump to the vacuum passage.

6. The substrate handling end effector of claim 1 wherein the vacuum passage is further adapted to be connected to a vacuum sensor.

7. The substrate transfer apparatus of claim 4 wherein the vacuum passage is further adapted to be connected to a vacuum sensor.

8. A semiconductor substrate transfer apparatus comprising:
    a drive;

an arm connected to the drive;

a vacuum source;

a liquid source; and an end effector coupled to the arm and adapted to support a substrate, the end effector comprising:

a substrate support comprising a vacuum passage connected to the vacuum source, and a liquid passage connected to the liquid source, said liquid passage connected to said vacuum passage for selectably drawing liquid from the liquid source through the vacuum passage.

9. The substrate transfer apparatus of claim 8 further comprising a controller, wherein the controller is adapted to dispense the liquid by selectively opening a purge valve connected between the liquid passage and the liquid source.

10. The substrate transfer apparatus of claim 8 wherein the arm comprises:

a first link coupled to the drive;

a second link coupled to the first link;

a wrist coupled to the second link; and the end effector is coupled to the wrist.

11. The substrate transfer apparatus of claim 8 wherein the vacuum source comprises a venturi connected to a pressure source.

12. The substrate transfer apparatus of claim 8 wherein the vacuum source comprises a vacuum pump.

13. The substrate transfer apparatus of claim 8 wherein the vacuum source comprises a vacuum pump and a vacuum valve connecting the vacuum pump to the vacuum passage.

14. The substrate transfer apparatus of claim 8 wherein the vacuum passage is further adapted to be connected to a vacuum sensor.

15. The substrate transfer apparatus of claim 13 wherein the vacuum passage is further adapted to be connected to a vacuum sensor.

16. A method of cleaning a vacuum passage in a substrate supporting end effector comprising the steps of:

connecting a vacuum source to a vacuum passage of a substrate support of the end effector;

connecting a source of liquid to a liquid passage of the substrate support; and connecting said liquid passage to said vacuum passage for selectably drawing liquid from the liquid source through the vacuum passage.

17. The method of cleaning a vacuum passage in a substrate supporting end effector of claim 16 wherein the step liquid is drawn from the liquid source by said vacuum.

18. The method of cleaning a vacuum passage in a substrate supporting end effector of claim 16 wherein the step of connecting a vacuum source to a vacuum passage of a substrate support of the end effector comprises the steps of connecting a venturi to the vacuum passage and connecting the venturi to a pressure source.

19. The method of cleaning a vacuum passage in a substrate supporting end effector of claim 16 wherein the step of connecting a vacuum source to a vacuum passage of a substrate support of the end effector comprises the step of connecting a vacuum pump to the vacuum passage.

20. The method of cleaning a vacuum passage in a substrate supporting end effector of claim 16 further comprising the step of connecting the vacuum passage to a vacuum chuck on the substrate supporting end effector.

* * * * *